United States Patent [19]

Shizukuishi et al.

[11] Patent Number: 5,053,647

[45] Date of Patent: Oct. 1, 1991

[54] PROGRAMMABLE LOGIC ARRAY HAVING FEEDBACK FLIP-FLOPS CONNECTED BETWEEN A PRODUCT ARRAY'S INPUTS AND ITS OUTPUTS

[75] Inventors: Makoto Shizukuishi, Kanagawa; Dave W. Brauer, Tokyo, both of Japan

[73] Assignee: Fuji Photo Film Co., Ltd., Kanagawa, Japan

[21] Appl. No.: 552,671

[22] Filed: Jul. 16, 1990

[30] Foreign Application Priority Data

Jul. 17, 1989 [JP] Japan .................................. 1-182586
Jul. 18, 1989 [JP] Japan .................................. 1-183549

[51] Int. Cl.$^5$ ......................................... H03K 19/177
[52] U.S. Cl. ..................... 307/465; 307/468; 364/716
[58] Field of Search ............ 307/465, 468, 469, 272.2; 364/716

[56] References Cited

U.S. PATENT DOCUMENTS

| | | | |
|---|---|---|---|
| 4,675,556 | 6/1987 | Dazes | 307/465 |
| 4,772,811 | 9/1988 | Fujioka et al. | 307/465 |
| 4,780,628 | 10/1988 | Illman | 307/465 |
| 4,858,178 | 8/1989 | Breuninger | 307/465 X |
| 4,903,223 | 2/1990 | Norman et al. | 364/716 |
| 4,912,342 | 3/1990 | Wang et al. | 307/468 X |
| 4,965,472 | 10/1990 | Anderson | 364/716 X |

FOREIGN PATENT DOCUMENTS

| | | | |
|---|---|---|---|
| 0343968 | 11/1989 | European Pat. Off. | 307/465 |
| 0099618 | 4/1988 | Japan | 307/465 |
| 0269317 | 10/1989 | Japan | 307/465.1 |

*Primary Examiner*—David Hudspeth
*Attorney, Agent, or Firm*—Sughrue, Mion, Zinn, Macpeak & Seas

[57] ABSTRACT

A programmable logic device including several flip-flop or counter circuits, a logical product matrix having product term lines, and a group of wiring lines. The group of wiring lines carry signals which are fed back to an input of a flip-flop or counter circuit.

11 Claims, 10 Drawing Sheets

PROGRAMMABLE LOGIC ARRAY HAVING FEEDBACK FLIP-FLOPS CONNECTED BETWEEN A PRODUCT ARRAY'S INPUTS AND ITS OUTPUTS

BACKGROUND OF THE INVENTION

The present invention relates to a programmable logic device in which circuit specifications original to circuit designers can be incorporated easily. The invention further relates to a programmable logic device suitable for forming internally and efficiently a sequential circuit necessary for sequential controllers, signal generators and the like.

As is well known, by use of a programmable logic device, it is possible to realize a suitable logic circuit having an AND-OR two-stage structure by programming lattice points of logical product and logical add matrices. The device is excellent in use for general purposes.

Not only can the programmable logic device be used as a random logic device, but the device can also be used as a controller such as, for example, a sequential controller because a desired sequential circuit can be provided by feeding the output of the logical add matrix to the input side of the logical product matrix.

In general, a conventional programmable logic device has such a configuration as shown in FIG. 1. As shown in FIG. 1, the conventional device has a logical product matrix having input signal lines $L_1-L_n$ represented by a group of vertical lines in the drawing and logical product term lines $l_1-l_n$ arranged to intersect the input signal lines and represented by a group of horizontal lines in the drawing and being provided for the purpose of attaining a desired logic circuit by suitably programming lattice points formed at the intersections thereof, and a logical add matrix (functionally represented by multiple-input gates $OR_1-OR_i$ in the drawing) conjugated through the logical product output (functionally represented by AND gates in the drawing) produced in the logical product term lines $l_1-l_n$. Further, there are provided general input ports $I_1-I_j$ for supplying logic signals from the outside to a part of the input signal lines $L_1-L_n$, a clock input terminal CLK for receiving a clock signal supplied thereto, and a control signal input terminal CNT for receiving a control signal supplied thereto. Further, output ports are formed for the purpose of feeding the output signals of the logical add matrix (multiple-input OR gates $OR_1-OR_i$ in the drawing) to the outside.

In the following, the output circuit as related to an output terminal $P_1$ in the output ports is described representatively. A certain logical add output (for example, $OR_1$) is connected to a data-input contact D of a D-type flip-flop circuit $FF_1$. An output contact Q of the flip-flop circuit is connected to an output terminal $P_1$ through an output buffer circuit $B_1$. A clock-input contact of the flip-flop circuit $FF_1$ is arranged so as to receive the clock signal from the clock-input terminal through an input buffer circuit. An output buffer circuit $FB_1$ operates corresponding to the logical level of the flip-flop circuit $FF_1$ so that the output signal of the flip-flop circuit $FF_1$ is transmitted to the output terminal $P_1$ or is turned to a high-impedance state. Further, the flip-flop circuit $FF_1$ is arranged so that the inverted output Q thereof is fed back to a part of the input signal lines $L_1-L_n$ through the buffer circuit $FB_1$. The output circuit as related to the other output terminals $P_2-P_k$ has the same construction as described above. In short, the output circuit has a cell structure.

For example, in the case where a signal generator for generating various kinds of digital signals different in frequency, phase and waveform and suitable for use of various kinds of electronic appliances is prepared by use of a conventional programmable logic device having the aforementioned structure, complex signals are formed by programming suitable lattice points of the logical product matrix to thereby form a shift-register or counter from the flip-flop circuits formed within the output circuit and, at the same time, by feeding the output thereof back to the logical product matrix.

However, a limitation in the number of bits (the number of flip-flop circuits) occurs in the conventional programmable logic device shown in FIG. 1 when various kinds of signals are generated, because the shift-register or counter is constituted within the output circuit by a plurality of flip-flop circuits each having a 1-bit structure. In most cases, it is difficult to form the signal generator by one programmable logic device. In general, the flip-flop circuit is designed to serve as a register for temporally registering the output signal before transmitting it to a corresponding output terminal. Accordingly, when the flip-flop circuits are used as the shift-register or counter, a great number of output terminals are left without use. Accordingly, there arises a problem in that efficiency in use of internal resources becomes poor, in that shortage of output ports occurs or in that the degree of freedom in design is lowered.

Further, as shown in FIG. 1, signals are always fed back to the logical product matrix through the multiple-input OR gates ($OR_1-OR_i$) provided in the output side of the logical add matrix. Accordingly, delay of signal transmission caused by the delay time of these OR gates occurs. Consequently, it is difficult to form fine-timing and high-frequency signals to overcome the delay time.

Another conventional device is shown in FIG. 2. The conventional device of FIG. 2 has a structure in which input signals $I_1-I_j$ from general input ports are fed to input signal lines $L_{A1}-L_{Aj}$, $L_{B1}-L_{Bj}$ of the logical product matrix through buffer circuits $B_1-B_j$ after being inverted or not being inverted. At the same time, the AND operation matrix 1 has input signal lines $L_{F1}-L_{Fk}$, $L_{D1}-L_{Dk}$ for receiving feedback signals from the output side (which will be described later). Further, the ends of logical product term lines $l_1-L_n$ intersecting these signal lines are connected to a group of input signal lines of the logical add matrix 2. Logical add term lines $g_1-g_k$ intersecting the group of input signal lines are respectively connected, through OR gates $OR_1-OR_k$, to the input contacts D of flip-flop circuits $FF_1-FF_k$ provided within the output circuit. The outputs (for example, the inverted outputs in the drawing) of the flip-flop circuits $FF_1-FF_k$ are fed back to the input signal lines $L_{F1}-L_{Fk}$, $L_{D1}-L_{Dk}$, for example, through buffer circuits $F_1-F_k$.

The logical add term lines $g_1-g_k$ represented by the solid line in the drawing show a desired number of signal lines. Each of the OR gates $OR_1-OR_k$ has a plurality of input contacts corresponding to the number of signal lines. The symbols $a_1-a_n$ designating AND gates functionally show the fact that logical products are obtained by programming lattice points (represented by "'" in FIG. 2 which will be described later. Of course, the AND gates are not formed individually in the respective ends of the logical product term lines.

Intersections or lattice points of the respective signal lines in the logical product matrix 1 and the logical add matrix 2 are programmed suitably to perform logical products and logical adds (by the logical product matrix in the case of a fixed-type OR matrix having lattice points programmed in advance) to thereby make these matrices 1 and 2 serve as decoders or the like. As described above, the device has a structure in which a predetermined circuit can be realized.

However, the conventional programmable logic device shown in FIG. 2 has the following problems The internally provided flip-flop circuits are provided to serve as registers for temporally registering output signals mainly to transmit the signals to output ports. In short, the flip-flop circuits are formed within the output circuit as shown in FIG. 2. Accordingly, in the case where these flip-flop circuits are used as a sequential circuit, output ports connected to the output contacts of the flip-flop circuits in advance are left without use. There arises a problem in effective use of the internal resources, shortage of output ports, and the like.

In the case where a binary counter is formed by programmably connecting these flip-flop circuits to decode the outputs (Q, Q') of the respective flip-flop circuits, glitch occurs in a point in which all output signals of the respective flip-flop circuit change simultaneously from "0" to "1" or from "1" to "0", as is well known. The glitch brings malfunction or the like within the circuit. Accordingly, there arises a problem in that circuits for removing the glitch must be considered in circuit design.

SUMMARY OF THE INVENTION

The present invention is configured to solve the aforementioned problems associated with the prior art devices. In short, an object of the present invention is to provide a programmable logic device having a structure suitable for forming sequential controllers, various kinds of signal generation circuits and the like, and in which effective use of chip space can be attained in the case where a large number of flip-flop circuits are used in forming a sequential circuit.

To attain the foregoing object, according to a first aspect of the present invention, the programmable logic device is configured to comprise a plurality of flip-flop circuits, a programmable logical product matrix including logical product term lines which intersect inverted output lines and non-inverted output lines of the flip-flop circuits, and a group of wiring lines for connecting the outputs from the flip-flop circuits directly to suitable input contacts of the flip-flop circuits through a part of the logical product lines, in which a suitable sequential logic circuit is formed by programmably setting suitable lattice points of the logical product matrix and feeding signals produced in the logical product term lines pertaining to the programmed lattice points back to suitable input contacts (data-input contacts and-/or reset-input contacts, set-input contacts or the like) of the flip-flop circuits or additionally provided gate circuits. The above-mentioned flip-flop circuits may be selected freely from various kinds of flip-flop circuits.

The device described herein shows the basic structure of the present invention, and conventional structures may be used in combination with the basic structure of the present invention. For example, there may be used a conventional technique in which flip-flop circuits as an output register are provided within the output circuit for the double purpose of feeding output signals from the flip-flop circuits to the output ports and feeding the output signals back to the logical product matrix.

According to a second aspect of the present invention, the programmable logic device for forming a desired logic circuit by programming lattice points of logical product term lines is configured such that the device comprises: a plurality of flip-flop circuits or counters; a first logical product matrix having at least a group of input signal lines supplied with outputs of the flip-flop circuits or counters, and a group of logical product term lines intersecting the group of input signal lines; a second logical product matrix having a group of input signal lines supplied with logical product outputs produced by programmably determining logical product term lines of the first logical product matrix, and a group of logical product term lines intersecting the group of input signal lines; a group of wiring lines for supplying logical product outputs produced by programmably determining other logical product term lines of the first logical product matrix to suitable input contacts of the flip-flop circuits or counters; and a group of wiring lines for supplying logical product outputs produced by programmably determining the logical product term lines of the second logical product matrix to reset signal input contacts of the flip-flop circuits or counters.

In the programmable logic device according to the first aspect of the present invention, a counter or shift-register having a desired modulo attained by a desired number of flip-flop circuits can be provided easily by suitably programming lattice points of the logical product matrix.

According to the present invention, a sequential circuit is not constituted by flip-flop circuits formed within the output circuit as in the prior art but is constituted by feeding signals from the logical product matrix back to the internally provided flip-flop circuits. Accordingly, wastefulness of resources such as for example occurrence of unused output ports can be avoided. Further, the output ports can be secured for their original function of signal output.

Because outputs from the logical product term lines of the logical product matrix are directly fed back to suitable input terminals of the flip-flop circuits or the like through logic product (AND), multiple-input OR gates required in the prior art for the purpose of passing feedback signals therethrough become unnecessary. Accordingly, not only can chip space be saved but also a high-speed sequential circuit can be provided.

According to the second aspect of the present invention, the internally provided flip-flop circuits or counters are programmed so as to be conjugated dependently to thereby attain a sequential circuit for generating various kinds of signals easily.

Further, because a sequential circuit is not constituted by flip-flop circuits formed within the output circuit as in the prior art but is constituted by feedback of the logical product term outputs from the logical product matrix directly to the flip-flop circuits or counters, delay time can be reduced greatly. Accordingly, not only can signals be generated in fine timing but also wastefulness of resources such as, for example, ocurrence of unused output ports can be avoided.

Further, because another logical product matrix is provided for the purpose of resetting the internally provided flip-flop circuits or counters, accurracy in resetting timing in the case where the flip-flop circuits are reset simultaneously can be improved compared with the case where reset signals are supplied independently from the first logical product matrix. As a result, not only can the flip-flop circuits or counters be operated stably but also the area required for the logical product matrices can be saved. Consequently, design of complicated timing can be realized.

According to the another embodiment of the present invention, the programmable logic device has a feature in that the device comprises a number, n, of cascade-connected flip-flop circuits, a programmable logical product matrix including logical product term lines which intersect inverted output lines and non-inverted output lines of the flip-flop circuits, and a group of wiring lines by which suitable signals produced in the logical product term lines are programmably connected so as to be fed back to an input contact of the first flip-flop circuit in the flip-flop circuits.

The present invention is not limited in the kind of flip-flop circuit; D-type flip-flop circuits, JK flip-flop circuits or any other kinds of flip-flop circuits may be used.

In the programmable logic device according to the present invention, a sequential circuit, such as a Johnson counter, a ring counter, a shift-register, or the like, can be formed easily by suitably programmably connecting these flip-flop circuits to the logical product matrix. Accordingly, wastefulness of internal resources in the prior art in which the sequential circuit must be formed by use of flip-flop circuits connected to output ports can be prevented.

Further, in the case where respective output signals of a Johnson counter are decoded, there occurs no glitch inevitable to the binary counter. Accordingly, not only can operation error be eliminated but also circuits for removing such glitch are not required. Consequently, effective use of internal resources can be attained.

PREFERRED EMBODIMENTS OF THE INVENTION

Several preferred embodiments of the present invention will be described hereunder with reference to the drawings.

Figure 3:
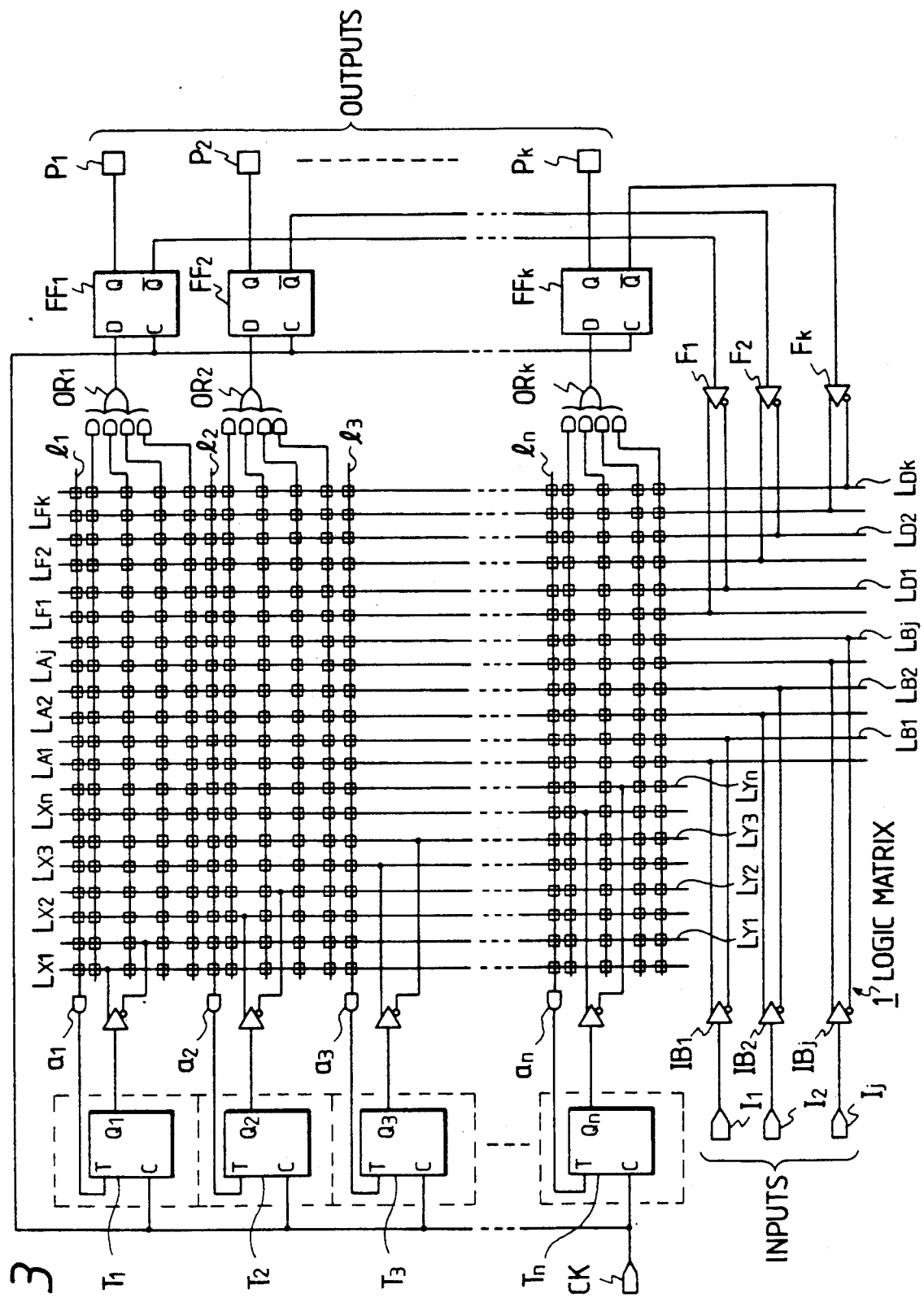
FIG. 3 is an explanatory diagram showing an example of the configuration of an embodiment of the present invention.

Referring to FIG. 3, there is shown an example in which the basic construction of the present invention including a built-in flip-flop circuit structure suitable for forming desired-bit counters is provided in combination with a conventional structure.

This embodiment mainly relates to the first aspect of the present invention discussed above.

As shown in FIG. 3, a plurality of flip-flop circuits (toggle flip-flop circuits in this embodiment) $T_1-T_n$ having non-inverted output contacts connected to input signal lines $L_{X1}-L_{Xn}$ which are a part of a logical product matrix 1 and inverted output contacts connected to other input signal lines $L_{Y1}-L_{Yn}$ which are another part of the logical product matrix 1 are formed in advance as shown within the broken line blocks. Further, the clock signal input contacts C of the respective flip-flop circuits $T_1-T_n$ are connected to a clock input terminal CK so that the flip-flop circuits can be operated in synchronism with a clock signal having a suitable frequency.

Further, the logical product matrix 1 has input signal lines $L_{A1}-L_{Aj}$, $L_{B1}-L_{Bj}$ to which input signals through general input ports and buffer circuits $IB_1-IB_j$ are to be supplied, and input signal lines $L_{F1}-L_{Fk}$, $L_{D1}-L_{Dk}$ to which signals fed back from the output circuit side (which will be described later) are to be supplied through buffer circuits $F_1-F_k$.

Figure 1:
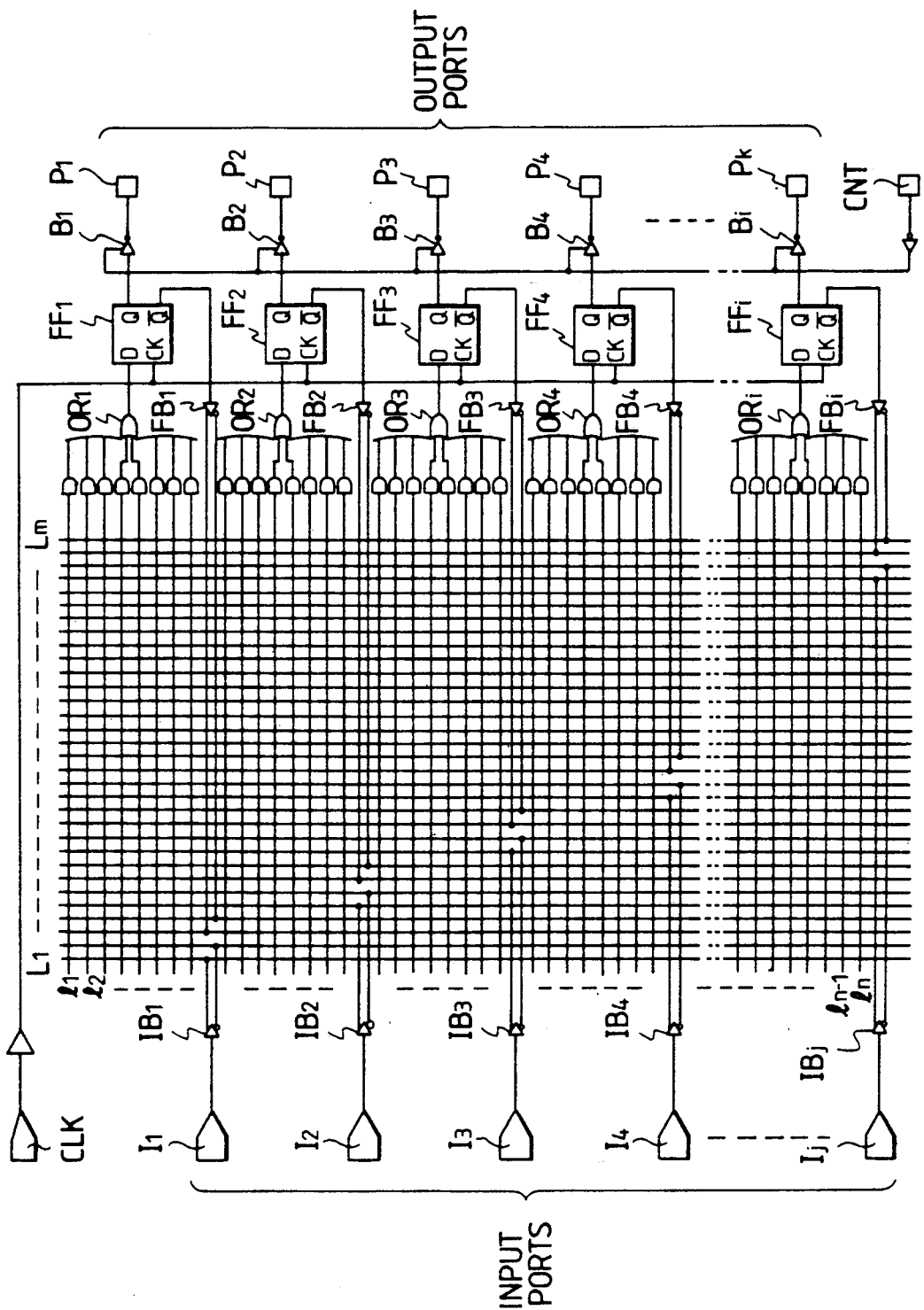
FIG. 1 is an explanatory diagram showing an example of configuration of a conventional device.

Further, the ends of logical product term lines $l_1-l_n$ intersecting those input signal lines are arranged so that signals can be fed back to internal flip-flop circuit blocks (surrounded by the broken lines in FIG. 1) through a part of logical products (ANDs) designated by $a_1-a_n$. Further, the ends of other logical product term lines or the ends of the aforementioned logical product term lines $l_1-l_n$ are connected to OR gates $OR_1-OR_k$ through other logical products (ANDs). The output contacts of the OR gates $OR_1-OR_k$ are connected to the input contacts of flip-flop circuits $FF_1-FF_k$ as output registers. The inverted outputs or non-inverted outputs of the flip-flop circuits $FF_1-FF_k$ are connected to the output terminals of output ports. The non-inverted output contacts or inverted output contacts are connected to the input signal lines $L_{F1}-L_{Fk}$, $L_{D1}-L_{Dk}$ of the logical product matrix 1 through the buffer circuits $F_1-F_k$.

As shown in FIG. 3, each of the OR gates $OR_1-OR_k$ has multiple input contacts. Though not shown, the reset input contacts or set input contacts of the flip-flop circuits have a structure in which signals can be fed back through logical products (ANDs).

Intersections or lattice points (represented by the symbol "''''" in the drawing) between the signal input lines $L_{X1}-L_{Xn}$, $L_{Y1}-L_{Yn}$, $L_{A1}-L_{Aj}$, $L_{B1}-L_{Bj}$, $L_{F1}-L_{Fk}$, $L_{D1}-L_{Dk}$ and the logical product lines $l_1-l_n$ (or the like) can be programmably formed so as to be connected electrically at these points.

In the programmable logic device having the aforementioned structure, suitable lattice points of the logical product matrix 1 can be programmably set to feed signals back to a suitable number of flip-flop circuits selected from the flip-flop circuits $T_1-T_n$ to thereby attain counters or the like.

Figure 4:
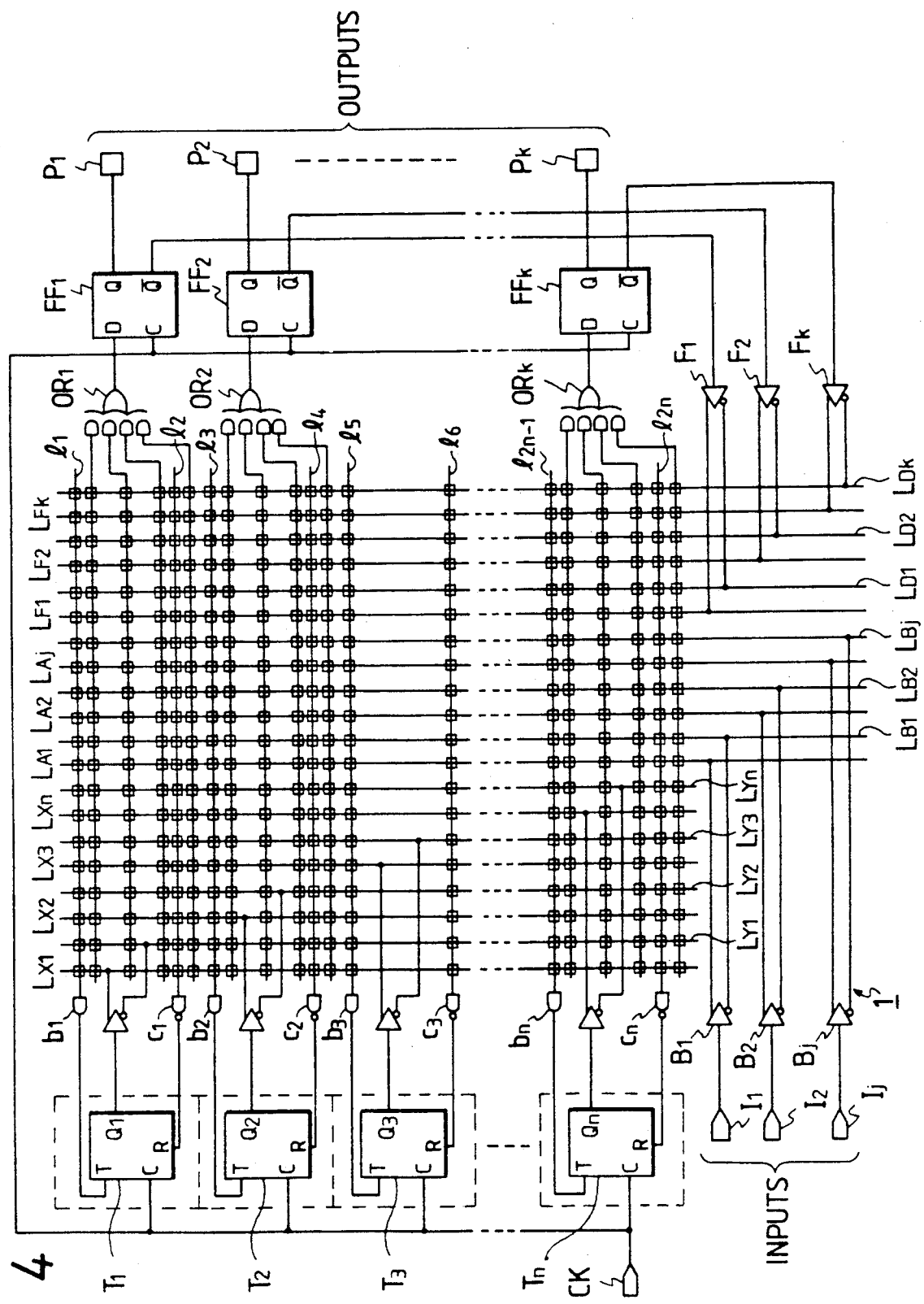
FIG. 4 is an explanatory diagram showing an example of the configuration of another embodiment of the present invention.

Referring to FIG. 4, there is shown another embodiment of the present invention in which desired-bit desired-modulo counters can be formed. This embodiment is different from the embodiment shown in FIG. 3 in that wiring passages for generating rest signal pulses to form desired-modulo counters and for feeding the reset signal pulses back to the internal flip-flop circuits $T_1-T_n$ are formed by programmably setting lattice points (represented by ″″ in the drawing) between the output signal lines of the flip-flop circuits $T_1-T_n$ as input signal lines of the logical product matrix 1 and the logical product term lines. In short, NAND outputs are fed back to reset terminals of flip-flop circuits in a predetermined number corresponding to the modulo number. In the case where the operation of resetting the flip-flop circuits in synchronized with the system clock CK, the real decoding value is set to be a value smaller by 1 (one) than the number of modulo. For example, in the case of realizing a 1/525 frequency division circuit from a 10-bit counter, 10 flip-flop circuits are used to decode all the respective output of the 10-bit counter, and a pulse is generated so as to be fed back to the reset terminals of the flip-flop circuits at the 524-th clock in order to reset the counter periodically at every 525-th clock. Thus, it is possible to attain the frequency division circuit.

Although those embodiments have shown the case where the flip-flop circuits $T_1-T_n$ are constituted by T-type flip-flop circuits, the present invention can be applied to the case where various kinds of synchronous and asynchronous flip-flop circuits such as JK flip-flop circuits, D-type flip-flop circuits or the like may be used internally. Further, preset terminals as well as reset terminals may be provided in the same manner as described above.

It is a matter of course that various sequential circuits can be provided corresponding to the ways of programming the logical product matrix.

According to those embodiments, devices such as signal generators for forming various kinds of high-speed sequential circuits can be provided efficiently.

A further embodiment of the present invention will be described hereunder with reference to FIG. 5 which relates to a programmable logic device suitable for attaining sequential circuits necessary for forming various kinds of signals by constructing desired-bit counters. In particular, FIG. 5 shows an embodiment related to the second aspect of the present invention which was discussed above.

Figure 5:
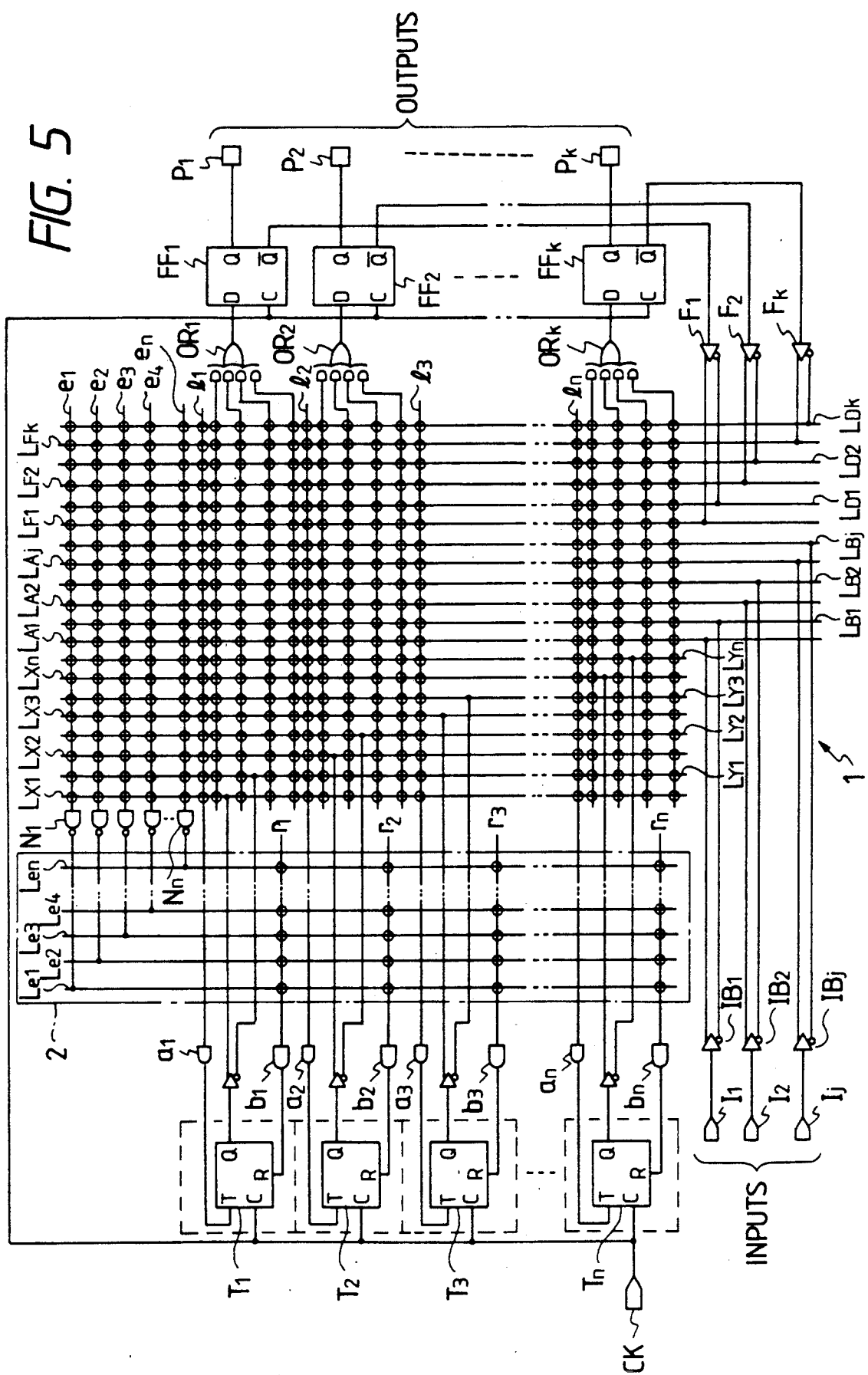
FIG. 5 is an explanatory diagram showing an example of configuration of a further embodiment of the present invention.

Describing now the construction of the device, the blocks represented by $T_1-T_n$ in FIG. 5 designate flip-flop circuits performing toggle operations. The clock signal input contacts C of the flip-flop circuits are connected to a common clock input terminal CK so as to receive a clock signal having a desired frequency. The signal output contacts Q of the respective flip-flop circuits are connected to a predetermined number of input signal lines $L_{X1}-L_{Xn}$, $L_{Y1}-L_{Yn}$ in the logical product matrix 1 through buffer circuits, respectively.

Further, the logical product matrix 1 has input signal lines $L_{A1}-L_{Aj}$, $L_{B1}-L_{Bj}$ for receiving input signals from the outside through general input ports and buffer circuits $IB_1-IB_j$, and input signal lines $L_{D1}-L_{Dk}$, $L_{F1}-L_{Fk}$ for receiving signals fed back from the output port side which will be described later. Further, a group of logical product term lines are provided to intersect these input signal lines $L_{X1}-L_{Xn}$, $L_{Y1}-L_{Yn}$, $L_{A1}-L_{Aj}$, $L_{B1}-L_{Bj}$, $L_{D1}-L_{Dk}$, $L_{F1}-L_{Fk}$ to thereby form lattice points (represented by !{ in the drawing) at the intersections.

Among the group of logical product term lines, logical product term lines $e_1-e_n$ are arranged so that the ends thereof are connected to input signal lines $L_{e1}-L_{en}$ of a second logical product matrix 2 through logical products (NAND) $N_1-N_n$ functionally attained by programmably setting lattice points.

In the second logical product matrix 2, intersections are formed with respect to these input signal lines $L_{e1}-L_{en}$.

Predetermined logical product term lines $l_1-l_n$ extended from the first logical product matrix 1 are connected to toggle input contacts T of corresponding flip-flop circuits through functional logical products (AND) programmably attained. Further, logical product term lines $r_1-r_n$ are connected to reset input contacts R of the corresponding flip-flop circuits through functional logical products (AND) programmably attained.

Further, other logical product term lines extended form the first logical product matrix 1 are connected to predetermined flip-flop circuits $FF_1-FF_k$ in the output ports through logical products (AND) programmably attained and multiple-input OR gates $OR_1-OR_k$. Output contacts of the flip-flop circuits $FF_1-FF_k$ are connected to predetermined output terminals and, at the same time, connected to the input signal lines $L_{D1}-L_{Dk}$, $L_{F1}-L_{Fk}$ of the first logical product matrix 1 through the feedback buffer circuits $F_1-F_k$.

In the programmable logic device having the aforementioned structure, counters can be realized easily by programmably setting suitable lattice points of the first and second logical product matrices. In particular, because reset signals for resetting the respective flip-flop circuits are formed by the second logical product matrix, accuracy in the flip-flop circuit resetting timing in the case where modulo-m counters are constructed to reset a plurality of flip-flop circuits for a desired modulo number m can be improved compared with the conventional case where flip-flop circuits are respectively individually reset in different resetting timing based on logical product output signals attained from the logical product matrix 1.

Figure 6:
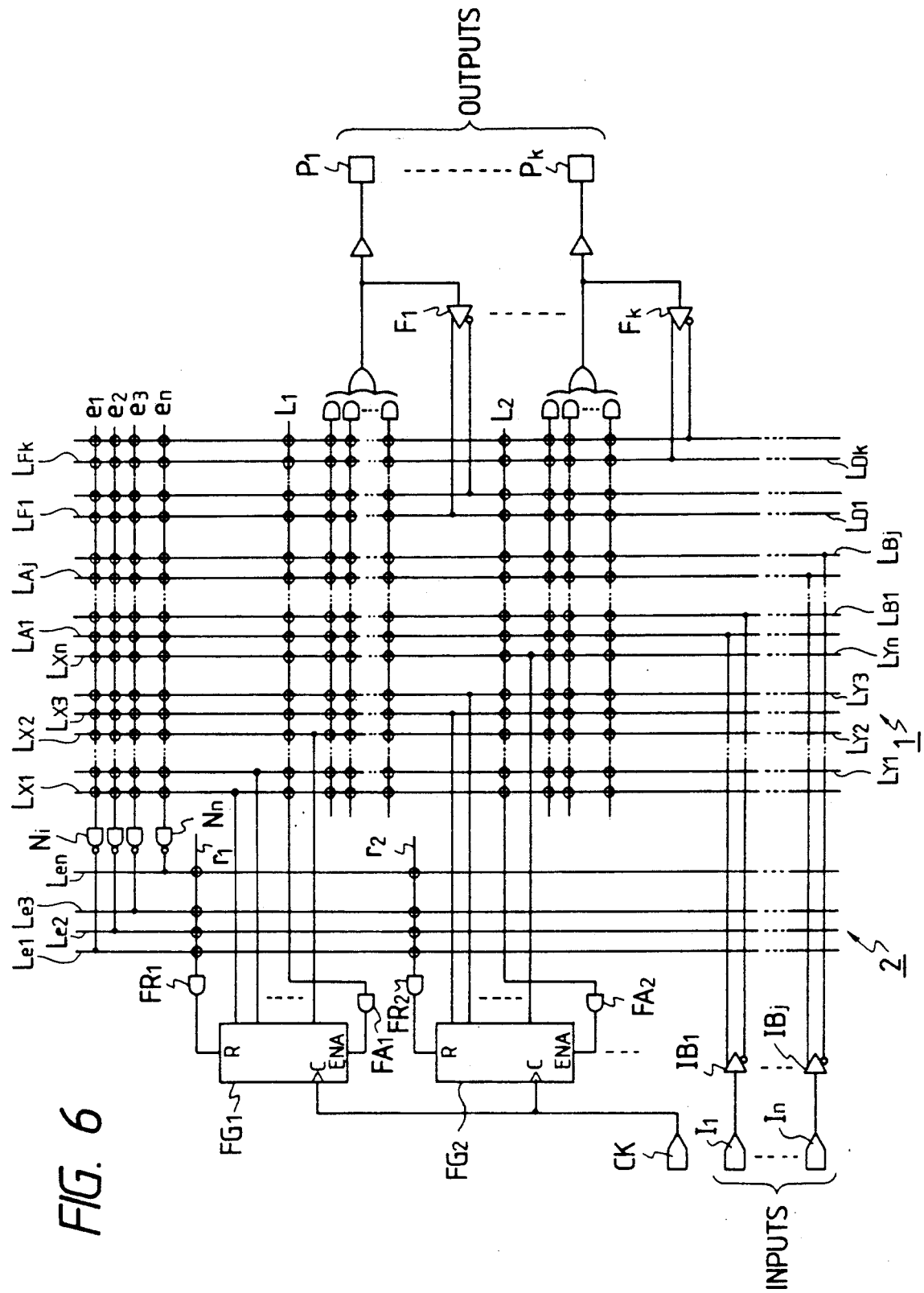
FIG. 6 is an explanatory diagram showing an example of configuration of a further embodiment of the present invention.

A further embodiment of the present invention will be described hereunder with reference to FIG. 6 in which items the same as or equivalent to those in FIG. 5 are reference correspondingly.

This embodiment is different from the embodiment shown in FIG. 5 in that the flip-flop circuits in FIG. 5 are replaced by counters $FG_1-FG_2$ different in the number of modulo.

In short, a group of logical product term lines having lattice points at intersections between these lines and input signal lines $L_{X1}-L_{Xn}$, $L_{Y1}-L_{Yn}$, $L_{A1}-L_{Aj}$, $L_{B1}-L_{Bj}$, $L_{D1}-L_{Dk}$, $L_{F1}-L_{Fk}$ of the first logical product matrix 1 and input signal lines $L_{e1}-L_{en}$ of the second logical product matrix 2 in the output port side. Further, predetermined logical product term lines $e_1-e_n$ of the first logical product matrix 1 are connected to predetermined input signal lines $L_{e1}-L_{en}$ of the second logical product matrix 2 through functional logical products (NANDs) programmably attained. Predetermined logical product term lines $r_1$, $R_2$, . . . provided to intersect these input signal lines are connected to clear-input contacts R of the counters $FG_1$, $FG_2$, . . . through functional logical products (AND) programmably attained. The first AND operation matrix 1 is connected to data-input or enable-input (ENA) contacts of the counters $FG_1$, $FG_2$, . . . through logical products (AND) $FA_1$, $FA_2$, . . functionally attained through logical product term lines $L_1$, $L_2$, . . .

Further, the bit outputs of the counters $FG_1$, $FG_2$, . . . are respectively connected to the input signal lines $L_{X1}-L_{Xn}$, $L_{Y1}-L_{Yn}$ of the first logical product matrix. These counters can be constituted by Johnson counters, binary counters, Gray code counters, or the like.

According to this embodiment having the aforementioned structure, signals having different frequencies corresponding to the counters can be generated simultaneously by suitably programming the first and second logical product matrices. Further, a counter having the number of modulo corresponding to the product of the respective numbers of modulo in the respective counters can be provided by programming the counters so as to be conjugated dependently. Consequently, various signals having different frequencies can be generated.

Figure 7:
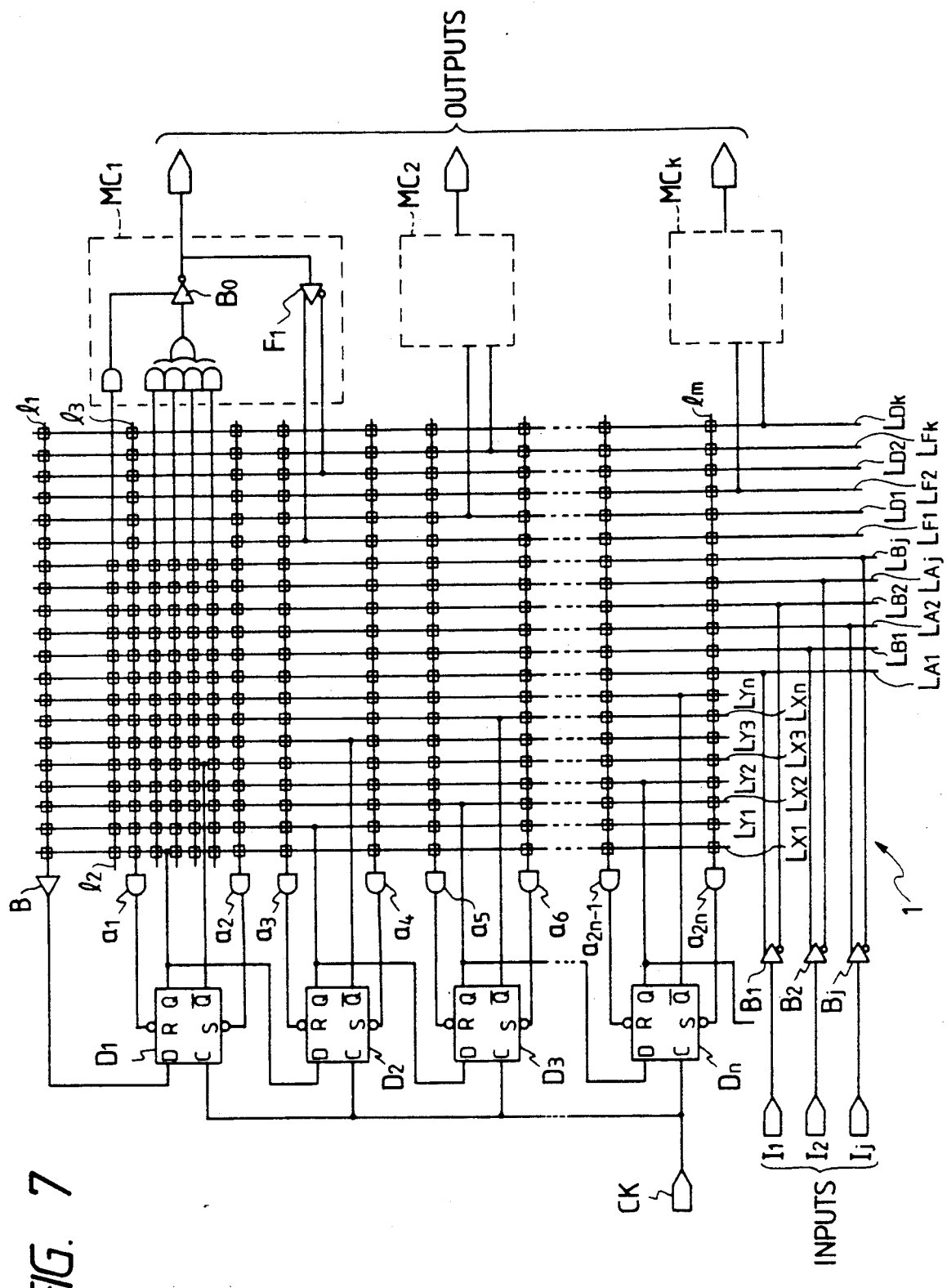
FIG. 7 is an explanatory diagram showing an example of the configuration of an embodiment of the present invention.

FIG. 7 shows another embodiment of the invention. As shown in FIG. 7, a logical product matrix 1 has vertical signal lines $L_{X1}-L_{Xn}$, $L_{Y1}-L_{Yn}$, $L_{A1}-L_{Aj}$, $L_{B1}-L_{Bj}$, $L_{F1}-L_{Fk}$, $L_{D1}-L_{Dk}$, and horizontal logical product term lines $l_1-l_m$ (represented by the solid line in the drawing) intersecting those signal lines. The logical product term lines $l_1-l_m$ are signal lines of the desired number.

In FIG. 7, the reference characters $D_1-D_n$ designate D-type flip-flop circuits having non-inverted output contacts Q connected to the signal lines $L_{X1}-L_{Xn}$, and inverted output contacts Q connected to the signal lines $L_{Y1}-L_{Yn}$, respectively.

The reference characters $B_1-B_j$ designate buffer circuits which serve to output, after inverted and not-inverted, the input signals $I_1-I_j$ received by the general input ports. The output contacts of the buffer circuits are connected to the signal lines $L_{A1}-L_{Aj}$, $L_{B1}-L_{Bj}$, respectively.

The signal lines $L_{F1}-L_{Fk}$, $L_{D1}-L_{Dk}$ are signal lines for receiving feedback signals from the output circuits $MC_1-MC_2$.

Intersections or lattice points (represented by the symbol "" in the drawing) between the signal input lines and the logical product lines can be programmably formed so as to be connected electrically at these points.

The non-inverted output contact Q of a flip-flop circuit corresponding to the lower bit is connected to the data input contact D of another flip-flop circuit corresponding to the upper bit so that all the respective flip-flop circuits $D_1-D_n$ are cascade-connected successively. Further, the respective clock-input contacts C of all the flip-flop circuits $D_1-D_n$ are connected commonly to a clock input terminal CK. The reset-input contacts R and set-input contacts S of the respective flip-flop circuits $D_1-D_n$ are connected to the ends of predetermined logical product term lines. The original functions of the AND gates $a_1-a_{2n}$ in the drawing can be attained by suitably programming lattice points, so that set signals and/or reset signals decoded in the logical product matrix can be fed back to the flip-flop circuits $D_1-D_n$.

The output contact of a buffer circuit $B_a$ connected to the end of the logical product term line $l_1$ is connected to the data-input contact D of the first flip-flop circuit $D_1$ so that the output signal of the logical product matrix 1 can be fed back.

The output circuits $MC_1$, $MC_2-MC_k$ are arranged so that signals produced in suitable logical product term lines of the logical product matrix 1 are connected to predetermined output terminals of the output ports. Referring to the output circuit $MC_1$, output signals are transmitted to the output terminals through a combination circuit (formed by programming the logical add matrix) constituted by fixed OR gates connected to ends of suitable logical product term lines and through the output buffer circuit $B_0$. The output buffer circuit $B_0$ is arranged so that the signal output thereof can be controlled based on the output signal of an logical product (AND) term line connected to the end of another logical product term line (for example, $l_2$ in the drawing). The signal to the output terminal is fed back to the signal lines $L_{F1}-L_{Fk}$, $L_{D1}-L_{Dk}$ after inverted and not inverted by the buffer circuit $F_1$.

Figure 8:
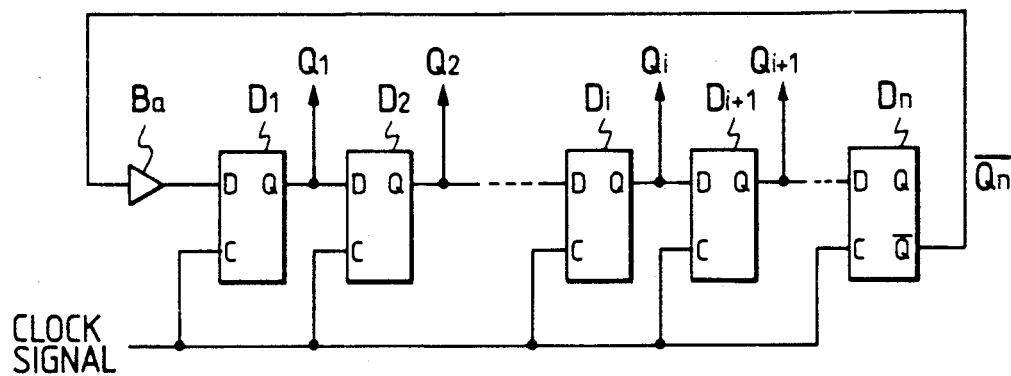
FIG. 8 is an explanatory diagram showing an example of the configuration of a Johnson counter in the embodiment of FIG. 7.

When the programmable logic device having the aforementioned configuration is constructed by programming suitable lattice points of the logical product matrix 1 to apply a clock signal having a predetermined frequency to clock input terminals CK, a Johnson counter having duty ratio of 50% equivalent to the circuit shown in FIG. 8 can be realized. Accordingly, signals having various kinds of waveforms can be obtained from the output ports by suitably decoding the output signal of the Johnson counter through the logical product matrix 1.

When, for example, the device is constructed to form a sequential circuit by use of a Johnson counter as in this embodiment, a decode output free from glitch can be obtained by ANDing at least two bit outputs of the Johnson counter. Furthermore, there is no necessity of decoding a large number of output signals from flip-flop circuits as in the binary counter. Accordingly, the sum of electric currents flowing in lattice points is reduced, so that power consumption can be reduced. In particular, the Johnson counter is free from glitch, so that circuit design can be carried out with no consideration of operation error and occurrence of error signals. There arises an effect in that the degree of freedom in circuit design can be improved.

Figure 9:
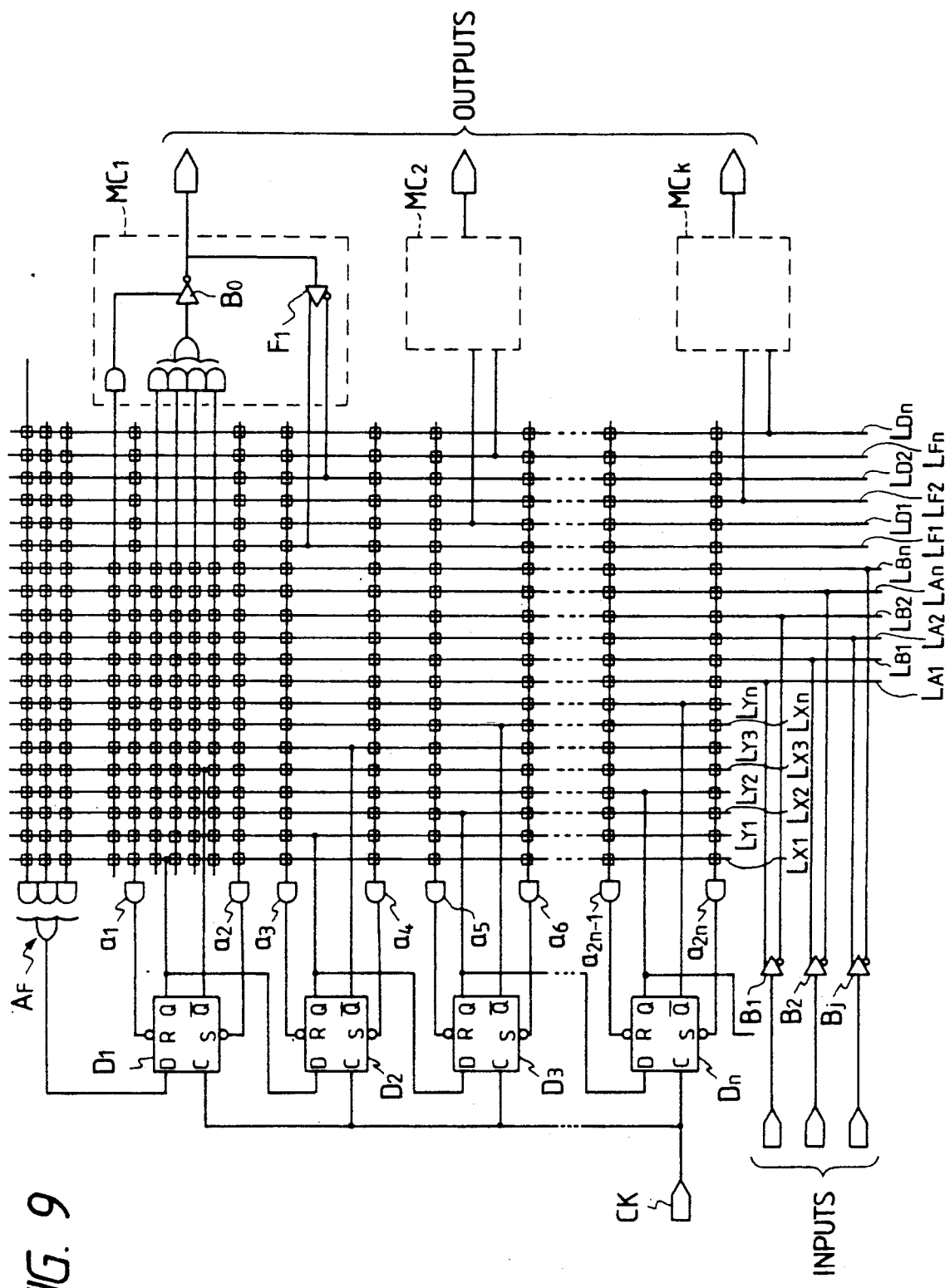
FIG. 9 is an explanatory diagram showing an example of the configuration of another embodiment of the present invention.

FIG. 9 shows another embodiment of the invention. This embodiment relates to a programmable logic device suitable for realizing a Johnson counter. This embodiment is different from the embodiment of FIG. 7 in that the data-input contact D of the first flip-flop circuit $D_1$ in this embodiment is connected to the output contact of a combination circuit $A_F$ having OR gates connected to the ends of logical product term lines $Z_1-Z_3$.

Figure 10:
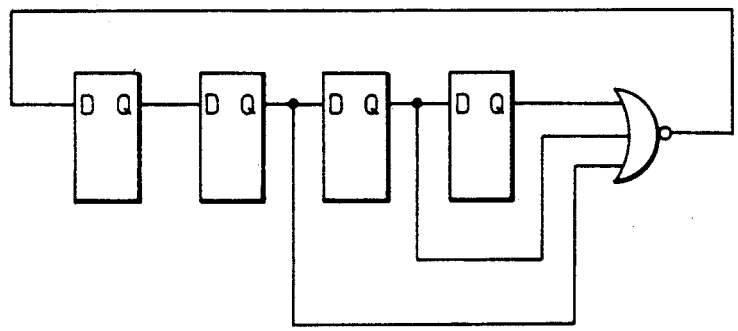
FIG. 10 is an explanatory diagram showing an example of the configuration of a Johnson counter in the embodiment of FIG. 9.

The combination circuit $A_F$ having an AND-OR gate function as shown in the drawing is formed by programmably conjugating suitable lattice points in the logical product term lines $Z_1-Z_3$. Further, non-inverted outputs or inverted outputs of suitable flip-flop circuits are fed back to the data-input contact D of the first flip-flop circuit $D_1$ through the combination circuit $A_F$, by which a Johnson counter having different duty ratio as shown in FIG. 10 can be provided. Furthermore, two or more kinds of Johnson counters respectively having suitable bit numbers can be formed by providing a plurality of blocks constituted by cascade-connected flip-flop circuits. In short, the degree of freedom in design can be improved greatly.

A further embodiment will be described hereunder with reference to FIG. 11.

This embodiment relates to a programmable logic device suitable for providing a sequential circuit by use of a Johnson counter. This embodiment is different from the embodiment in FIG. 9 in that a JK flip-flop circuit is prepared as the first flip-flop circuit $D_1$ in which: the output contact of the logical product (AND) $A_{X1}$ obtained from the logical product term line $X_1$ intersecting the inverted output lines $Q_1-Q_n$ of the flip-flop circuits $D_1-D_n$ is connected to the J input contact of the JK flip-flop circuit $D_1$; and the output contact of the logical product (AND) $A_{X2}$ connected to the end of the logical product term line $X_2$ intersecting the non-inverted output lines $Q_1-Q_n$ of the flip-flop circuits $D_1-D_n$ is connected to the K input contact of the JK flip-flop circuit $D_1$.

Figure 12:
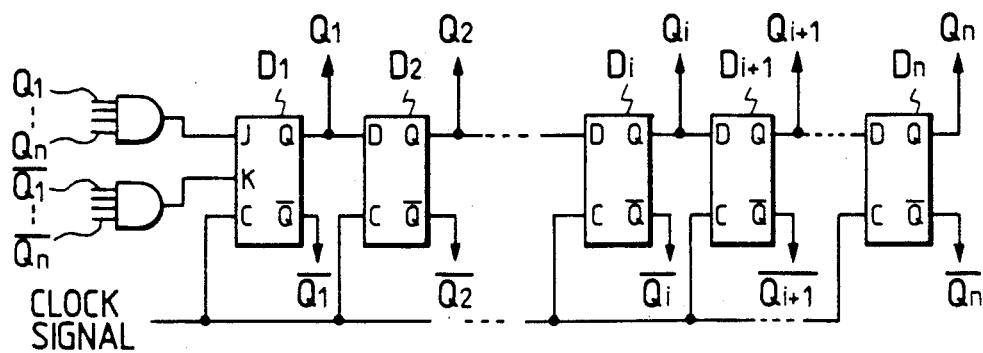
FIG. 12 is an explanatory diagram showing an example of the configuration of a Johnson counter in the embodiment of FIG. 11.

A desired-bit-length Johnson counter having a trapping preventing function as shown in FIG. 12 can be formed by programmably conjugating suitable lattice points in the logical product term lines $X_1$ and $X_2$ to feed the non-inverted outputs of suitable flip-flop circuits back to the J input contact of the first flip-flop circuit $D_1$ through the combination circuit $A_{X1}$ and, at the same time, feed the inverted outputs of suitable flip-flop circuits back to the K input contact of the first flip-flop circuit $D_1$ through the combination circuit $A_{X2}$.

As described above, according to the embodiments of FIGS. 7, 9 and 11, a predetermined number of cascade-connected flip-flop circuits are internally provided in advance to form a sequential circuit, so that there is no necessity of using flip-flop circuits provided within the output circuit as in the prior art. Accordingly, effective use of the output terminals in the output ports can be secured. Further, these embodiments are constructed so that the flip-flop circuits can be directly fed back from the logical product term lines of the logical product matrix. Accordingly, a high-speed sequential circuit can be provided.

Figure 2:
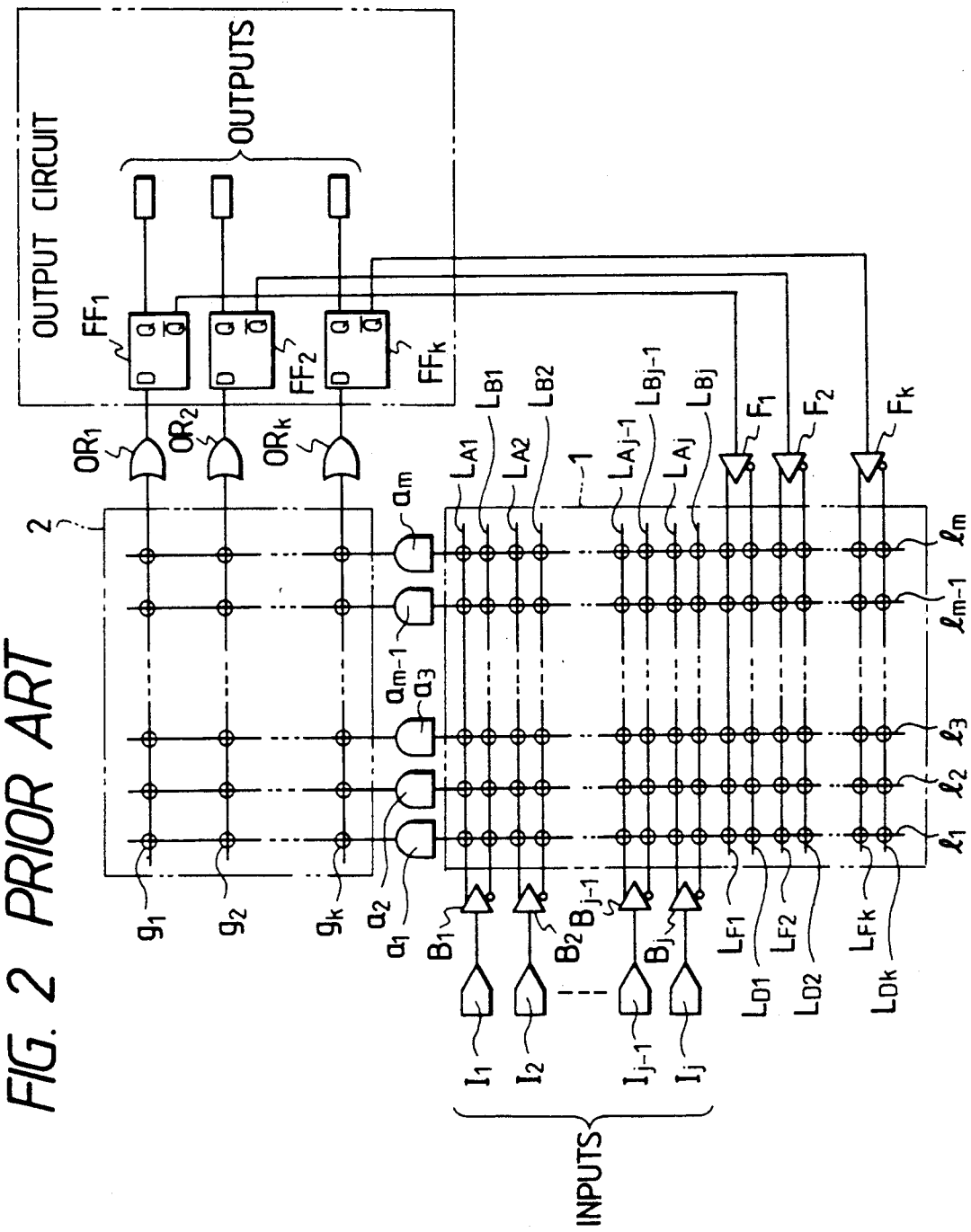
FIG. 2 is an explanatory diagram showing an example of the configuration of a conventional programmable logic device.
Figure 11:
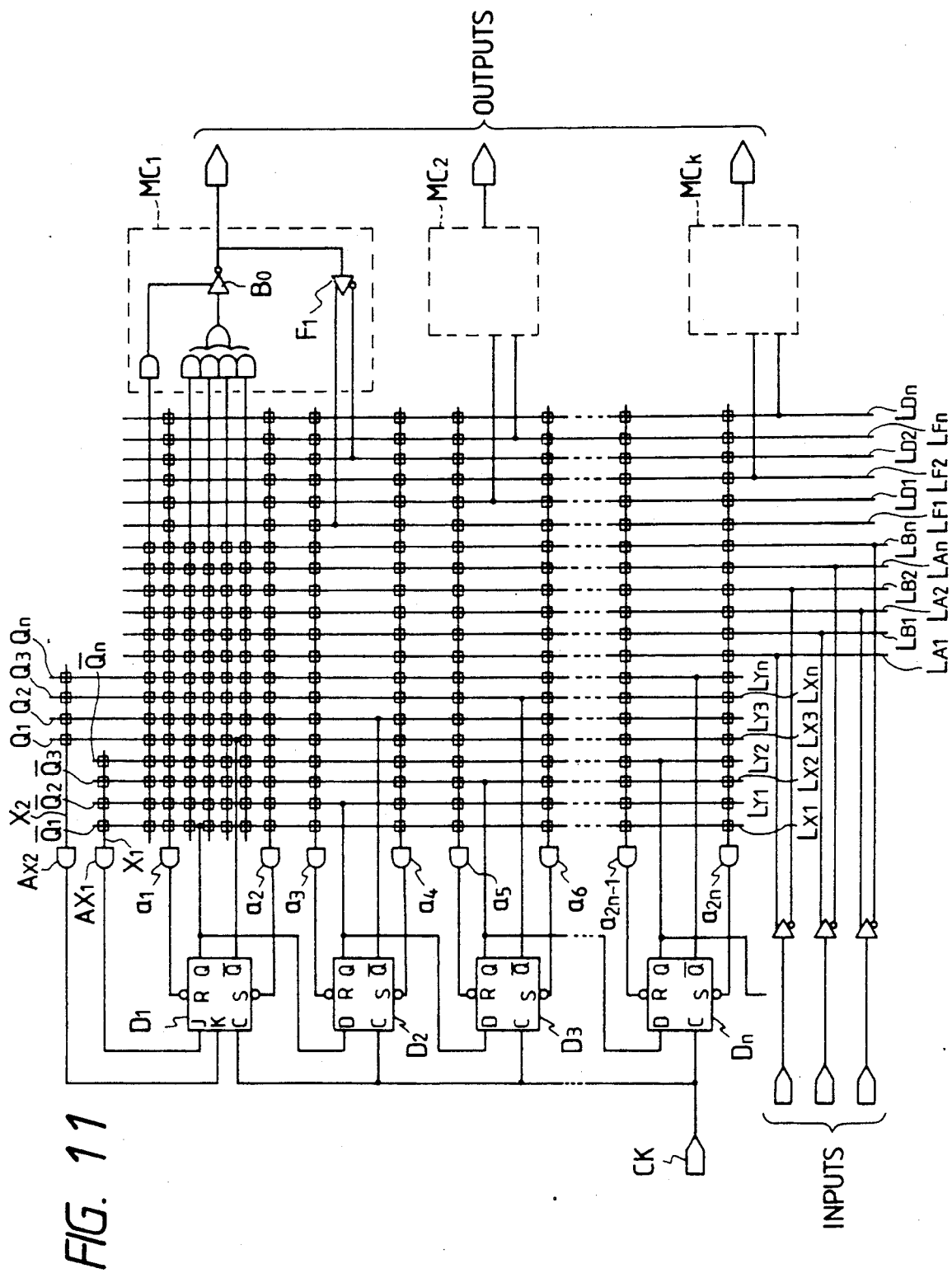
FIG. 11 is an explanatory diagram showing an example of the configuration of a further embodiment of the present invention.

Although the embodiments illustrated in FIGS. 7, 9 and 11 show examples of circuit configuration of the output circuits $MC_1-MC_k$, it is to be understood that the present invention is not limited to the specific embodiments and that modifications and changes may be made. For example, any circuit, for example, which includes flip-flop circuits acting as an output register as in the conventional device shown in FIG. 2, or any other circuits may be used.

Although these embodiments have shown the case where a Johnson counter is used as a sequential circuit, the present invention can be applied to the case where a ring counter or a shift-register may be used.

According to these embodiments, signal generators for forming various kinds of high-speed sequential circuits can be realized efficiently.

As described above, according to the embodiments of FIGS. 3-6 of the present invention, a counter, shift-register or the like, having a desired number of modulo formed by a desired number of flip-flop circuits, can be provided easily by suitably programming lattice points in the logical product matrix. Furthermore, because suitable counters can be freely programmably selected from various kinds of counters such as binary counters, Gray code counters, Johnson counters and the like, circuits can be designed corresponding to the purposes. Accordingly, not only can the degree of freedom in design be improved compared with the conventional programmable logic device, but also efficiency in use of the internal electric source is high. In short, a sequential circuit is not constituted by flip-flop circuits formed within the output circuit as in the prior art but is constituted by a plurality of flip-flop circuits based on feedback from the AND operation matrix. Accordingly, wastefulness of resources such as for example occurrence of unused output ports can be avoided. Because outputs from the logical product term lines of the logical product matrix are directly fed back to suitable input terminals (data- input terminals or reset terminals) of the flip-flop circuits, multiple-input OR gates required in the prior art for the purpose of receiving outputs from logical product term lines are no required. Accordingly, not only can chip space be saved but a sequential circuit for generating a plurality of signals having high-speed and complicated waveforms can be provided. In particular, high-speed operations can be attained so that the present invention is suitable for providing signal generation circuits for generating various kinds of synchronizing signals, pattern generators, programmable frequency division circuits, various kinds of sequence controllers, and the like.

Further, there arises an effect in that design/development tools can be automated easily.

In particular, according to the second aspect of the present invention, another logical product matrix is provided to form reset signals supplied to a plurality of flip-flop circuits or counters which are formed so as to transit output signals to input signal lines of the AND operation matrix. Accordingly, output signals complex and high in timing accuracy can be formed by resetting these flip-flop circuits or counters in suitable timing.

As described above, the device according to the embodiments of FIGS. 7, 9 and 11 has a number, n, of cascade-connected flip-flop circuits which can constitute a counter or register, such as a Johnson counter, a ring counter, a shift-register, or the like, having n bits at the maximum through programmed connection, a programmable logical product matrix including logical product term lines which intersect inverted output lines and non-inverted output lines of the flip-flop circuits, and a group of wiring lines by which suitable signals produced in the logical product term lines are programmably connected so as to be fed back to an input contact of the first flip-flop circuit in the flip-flop circuits. Accordingly, not only is the device particularly suitable for producing a sequential circuit formed by connecting multiple flip-flop circuits, but also an effect for improvement in the degree of circuit integration and effective use of internal resources can be attained.

Further, because the Johnson counter can be formed easily, the simultaneous change of the internal states of the flip-flop circuits corresponding to the bits as in the binary counter can be prevented. Accordingly, in the case where the outputs of the flip-flop circuits are decoded, desired waveforms can be obtained through a small number (two or more) of signal lines. Accordingly, the number of program points necessary for decoding can be reduced, so that power consumption can be reduced.

In particular, the programmable logic device according to the present invention suitable for forming sequence controllers and signal generation circuits for generating signals having various kinds of waveforms.

What we claim is:

1. A programmable logic device comprising:
   a plurality of flip-flop circuits;
   a logical product matrix including logical product term lines which intersect inverted output lines and non-inverted output lines of said flip-flop circuits; and
   a group of wiring lines for connecting outputs produced from a part of said logical product term lines to input contacts of said flip-flop circuits;
   wherein a sequential logic circuit is formed by programmably connecting lattice points of said logical product matrix and feeding-back signals produced in the logical product term lines pertaining to said programmed lattice points to input contacts of a circuit block including said flip-flop circuits through said group of wiring lines.

2. The programmable logic device according to claim 1, wherein said group of wiring lines connect logical product (AND) outputs produced from a part of said logical product term lines to input contacts of said flip-flop circuits.

3. The programmable logic device according to claim 1, wherein said group of wiring lines connected inverted logical product (NAND) outputs from a part of said logical product term lines to input contacts of said flip-flop circuits.

4. The programmable logic device according to claim 1, wherein the outputs produced from a part of said logical product term lines are directly connected to input contacts of said flip-flop circuits.

5. The programmable logic device according to claim 1, wherein each of said plurality of flip-flop circuits is a T-type flip-flop circuit.

6. A programmable logic device for forming a desired logic circuit by programming lattice points of logical product term lines, comprising:
   a plurality of flip-flop circuits;
   a first logical product matrix having at least a group of input signal lines supplied with outputs of said flip-flop circuits, and a group of logical product term lines intersecting said group of input signal lines;
   a second logical product matrix having a group of input signal lines supplied with logical product outputs produced by programmably determining logical product term lines of said first logical product matrix, and a group of logical product term lines intersecting said group of input signal lines;
   a group of wiring lines for supplying logical product outputs produced by programmably determining other logical product term lines of said first logical product matrix to suitable input contacts of said flip-flop circuits; and
   a group of wiring lines for supplying logical product outputs produced by programmably determining said logical product term lines of said second logical product matrix to reset signal input contacts of said flip-flop circuits.

7. A programmable logic device for forming a desired logic circuit by programming lattice points of logical product term lines, comprising:
   a plurality of counters;
   a first logical product matrix having at least a group of input signal lines supplied with outputs of said counters, and a group of logical product term lines intersecting said group of input signal lines;
   a second logical product matrix having a group of input signal lines supplied with logical product outputs produced by programmably determining logical product term lines of said first logical product matrix, and a group of logical product term lines intersecting said group of input signal lines;
   a group of wiring lines for supplying logical product outputs produced by programmably determining other logical product term lines of said first logical product matrix to suitable input contacts of said counters; and
   a group of wiring lines for supplying logical product outputs produced by programmably determining said logical product term lines of said second logical product matrix to reset signal input contacts of said counters.

8. A programmable logic device comprising:
   first through n cascade-connected flip-flop circuits;
   a programmable logical product matrix including logical product term lines which intersect inverted output lines and non-inverted output lines of said flip-flop circuits; and
   a group of wiring lines by which suitable signals produced in said logical product term lines are programmably connected so as to be fed back to an input contact of said first flip-flop circuit.

9. The programmable logic device according to claim 8, further comprising a buffer circuit connected to the input contact of said first flip-flop circuit.

10. The programmable logic device according to claim 8, further comprising logical gate means connected to the input contact of said first flip-flop circuit.

11. The programmable logic device according to claim 8, further comprising a plurality of AND gates, and wherein said first flip-flop circuit is a JK-type flip-flop circuit having a J-input contact and a K-input contact, one of said AND gates being connected to the J-input contact and a different one of said AND gates being connected to the K-input contact.

* * * * *